United States Patent
Nakai et al.

(10) Patent No.: US 8,835,284 B2
(45) Date of Patent: Sep. 16, 2014

(54) METHOD OF MANUFACTURING ANNEALED WAFER

(75) Inventors: Katsuhiko Nakai, Yamaguchi (JP); Masamichi Ohkubo, Burghausen (DE)

(73) Assignee: Siltronic AG, Munich (DE)

(*) Notice: Subject to any disclaimer, the term of this patent is extended or adjusted under 35 U.S.C. 154(b) by 0 days.

(21) Appl. No.: 13/977,497

(22) PCT Filed: Dec. 5, 2011

(86) PCT No.: PCT/EP2011/071736
§ 371 (c)(1),
(2), (4) Date: Jun. 28, 2013

(87) PCT Pub. No.: WO2012/089441
PCT Pub. Date: Jul. 5, 2012

(65) Prior Publication Data
US 2013/0273719 A1    Oct. 17, 2013

(30) Foreign Application Priority Data
Dec. 29, 2010 (JP) ................. 2010-294539

(51) Int. Cl.
*H01L 21/322* (2006.01)
*C30B 15/20* (2006.01)
*C30B 29/06* (2006.01)
*H01L 21/02* (2006.01)

(52) U.S. Cl.
CPC ........ *H01L 21/02664* (2013.01); *C30B 15/203* (2013.01); *C30B 29/06* (2013.01)
USPC ................ 438/473; 117/13; 117/15; 117/20; 117/34

(58) Field of Classification Search
None
See application file for complete search history.

(56) References Cited

U.S. PATENT DOCUMENTS

2006/0266278 A1* 11/2006 Ono et al. ............ 117/19
2008/0187736 A1   8/2008 Sattler et al.

FOREIGN PATENT DOCUMENTS

| EP | 1624094 A1 | 2/2006 |
|---|---|---|
| EP | 1804283 A1 | 7/2007 |
| EP | 1887110 A1 | 2/2008 |
| JP | 2000281491 A | 10/2000 |
| JP | 2006312576 A | 11/2006 |
| JP | 2007176732 A | 7/2007 |
| JP | 2010155748 A | 7/2010 |

OTHER PUBLICATIONS

W.V. Ammon et al., "Formation of Stacking Faults in Nitrogen-Doped Silicon Single Crystals", Microelectronic Engineering vol. 66 Apr. 1, 2003, pp. 234-236.

* cited by examiner

*Primary Examiner* — Yasser A Abdelaziez
(74) *Attorney, Agent, or Firm* — Brooks Kushman P.C.

(57) ABSTRACT

Annealed wafers having reduced residual voids after annealing and reduced deterioration of TDDB characteristics of an oxide film formed on the annealed wafer, while extending the range of nitrogen concentration contained in a silicon single crystal, are prepared by a method wherein crystal pulling conditions are controlled such that a ratio V/G between a crystal pulling rate V and an average axial temperature gradient G is $\geq 0.9 \times (V/G)_{crit}$ and $\leq 2.5 \times (V/G)_{crit}$, and hydrogen partial pressure is $\geq 3$ Pa and $\leq 40$ Pa. The silicon single crystal has a nitrogen concentration of $>5 \times 10^{14}$ atoms/cm$^3$ and $\leq 6 \times 10^{15}$ atoms/cm$^3$, a carbon concentration of $\geq 1 \times 10^{15}$ atoms/cm$^3$ and $\leq 9 \times 10^{15}$ atoms/cm$^3$, and heat treatment is performed in a noble gas atmosphere having an impurity concentration of $\leq 5$ ppma, or in a non-oxidizing atmosphere.

4 Claims, 3 Drawing Sheets

METHOD OF MANUFACTURING ANNEALED WAFER

CROSS-REFERENCE TO RELATED APPLICATIONS

This application is the U.S. national phase of PCT Appln. No. PCT/EP2011/071736 filed Dec. 5, 2011, which claims priority to Japanese Patent Application No. 2010-294539 filed Dec. 29, 2010, the disclosures of which are incorporated in their entirety by reference herein.

BACKGROUND OF THE INVENTION

1. Field of the Invention

The present invention relates to a method of manufacturing an annealed wafer obtained by subjecting a silicon single crystal wafer to high-temperature heat treatment.

2. Description of the Related Art

Annealed wafers obtained by subjecting silicon single crystal wafers to heat treatment at a high temperature have been widely used as high-quality substrates for manufacturing semiconductor devices.

Generally, a silicon single crystal wafer has a defect called a void defect. Here, the "void defect" refers to a defect caused as a result of aggregation of introduced atomic-level vacancies at an interface between a silicon melt and a crystal during crystal growth. Among the "void defects", the one exposed in a surface of the silicon single crystal wafer is called a COP (Crystal Originated Particle).

By subjecting the silicon single crystal wafer to heat treatment at a high temperature of, for example, not less than 1100° C., the above "void defects" shrink or are eliminated, and the defects in the surface of the wafer can be reduced. Further, by adding nitrogen to the silicon single crystal wafer, the size of the "void defects" is reduced, and the "void defects" shrink or are eliminated readily by heat treatment.

On the other hand, the silicon single crystal wafer also contains oxygen precipitates. "Oxygen precipitates" are generated when oxygen mixed into the silicon melt from a quartz crucible blends into the crystal in a concentration more than a saturating concentration, and is aggregated by the heat treatment described above. The "oxygen precipitates" in the surface of wafer are reduced by the heat treatment described above. The "oxygen precipitates" can be generated inside the wafer by adding nitrogen to the silicon single crystal wafer.

By adding nitrogen to the silicon single crystal wafer and subjecting the silicon single crystal wafer to heat treatment at a high temperature as described above, it is possible to form a substantially denuded region with a thickness of about several microns in the surface of the wafer, and to leave appropriate "void defects" and "oxygen precipitates" inside the wafer. That is, a high-quality silicon single crystal wafer can be obtained.

As one of control parameters when pulling a silicon crystal by the Czochralski method, "V/G" has been known. Here, "V (mm/min)" represents the pulling rate of the silicon crystal, and "G (° C./mm)" represents the temperature gradient in an axial direction when the silicon crystal is grown.

Japanese Patent Laid-Open Application No. 2007-176732 describes an invention which focuses on the relationship between "V/G" described above and nitrogen concentration, and attempts to obtain an annealed wafer in which precipitation of oxygen after annealing is sufficiently high and oxygen precipitates in a wafer surface have a uniform density. In addition, Japanese Patent Laid-Open Application No. 2010-155748 describes a method of manufacturing an annealed wafer which adds nitrogen and hydrogen into a furnace for pulling a silicon single crystal to control "V/G", in order to obtain a denuded zone with a thickness of not less than 10 μm in a surface of a silicon single crystal wafer, in the case where a high concentration of nitrogen (not less than 5E14 atoms/cm$^3$) is contained.

In contrast, Japanese Patent Laid-Open Application No. 2006-312576 describes a method of manufacturing a silicon single crystal which does not focus on "V/G" but adds a gas of a substance containing hydrogen atoms to an atmosphere gas within the growth apparatus and further dopes nitrogen or/and carbon into the crystal. In addition, Japanese Patent Laid-Open Application No. 2000-281491 describes a method of manufacturing a silicon single crystal which grows the silicon single crystal by the Czochralski method, by continuously introducing hydrogen gas at 3% by volume to 0.1 ppm into an atmosphere.

It has been found that, if a substrate cut out from a crystal having a nitrogen within a certain range is used as a substrate of an annealed wafer, there arises a problem in the quality of the annealed wafer. Specifically, if the nitrogen concentration is less than 1E15 atoms/cm$^3$ (that is, less than $1 \times 10^{15}$ atoms/cm$^3$), the number of voids remaining in the wafer surface after annealing is increased. It has also been found that, if the nitrogen concentration exceeds 4E15 atoms/cm$^3$, Time Dependent Dielectric Breakdown (TDDB) characteristics of an oxide film formed on the annealed wafer are deteriorated.

The reason for the increase in the number of voids remaining in the wafer surface after annealing when the nitrogen concentration is less than 1E15 atoms/cm$^3$ is because a crystal having a nitrogen concentration of less than 1E15 atoms/cm$^3$ has voids which are much larger (not less than 0.5 μm) than conventionally known voids with a size of about 0.2 μm, and which have a low density (not more than 1E4/cm$^3$), and they are not fully eliminated by annealing.

On the other hand, the reason for the deterioration of the TDDB characteristics of the oxide film formed on the annealed wafer when the nitrogen concentration exceeds 4E15 atoms/cm$^3$ is because a crystal pulled under a condition in which nitrogen is present within a high range has grown-in defects, which have not been known and are different from voids, and they are not eliminated by annealing.

Therefore, the range of the nitrogen concentration is limited to not less than 1E15 atoms/cm$^3$ and not more than 4E15 atoms/cm$^3$. If the range of the nitrogen concentration is narrow, a top portion of the crystal having a low nitrogen concentration and a bottom portion of the crystal having a high nitrogen concentration cannot be used as a product wafer, and thus crystal yield is reduced, making it difficult to manufacture the annealed wafer at low cost.

With the methods of Japanese Patent Laid-Open Application No. 2007-176732, Japanese Patent Laid-Open Application No. 2010-155748, and Japanese Patent Laid-Open Application No. 2000-281491, an annealed wafer using a substrate cut out from a crystal having a nitrogen concentration of less than 1E15 atoms/cm$^3$ has many residual voids, and an annealed wafer using a substrate cut out from a crystal having a nitrogen concentration of more than 4E15 atoms/cm$^3$ has deteriorated TDDB characteristics. Therefore, the range of the nitrogen concentration is limited to not less than 1E15 atoms/cm$^3$ and not more than 4E15 atoms/cm$^3$. Since the range of the nitrogen concentration is limited to a narrow range, crystal yield is reduced, making it difficult to manufacture the annealed wafer at low cost.

In contrast, in Japanese Patent :Laid-Open Application No. 2006-312576, it is necessary to grow a crystal under a condition in which no grown-in defects are present, which requires that the crystal should be grown with V/G as a crystal growth parameter described later being limited to a very narrow range. To grow the crystal in such a narrow range, it is necessary to add special ingenuity to a crystal growth apparatus. For example, Japanese Patent Laid-Open Application No. 2006-312576 discloses making the temperature gradient of a crystal peripheral portion lower than the temperature gradient of a crystal central portion during crystal growth. However, such ingenuity results in a reduction in crystal growth rate (for example, according to Japanese Patent Laid-Open Application No. 2006-312576, the pulling rate is about 0.3 to 0.6 mm/min). As a result, the productivity of the crystal is reduced, and the manufacturing cost of the silicon wafers is increased in total, although there is no need for annealing. Further, if the range of V/G is limited to a narrow range, this results in an increase in an area of the crystal which is out of the V/G range due to variations in crystal growth, causing a reduction in crystal yield.

SUMMARY OF THE INVENTION

The present invention has been made to solve problems as described above, and one object of the present invention is to provide a method of manufacturing an annealed wafer capable of avoiding residual voids after annealing and deterioration of TDDB characteristics of an oxide film formed on the annealed wafer, and extending the range of nitrogen concentration that can be contained in a silicon single crystal.

These and other objects are achieved by a method of manufacturing an annealed wafer in accordance with the present invention, which includes the steps of: growing a silicon single crystal to which nitrogen, carbon, and hydrogen are added, by the Czochralski method; cutting out a substrate from the silicon single crystal; and heat treating the cut-out substrate. With respect to growth conditions for manufacturing the silicon single crystal by the Czochralski method, if the ratio between the crystal pulling rate V (mm/min) and the average temperature gradient G (° C./mm) in a crystal growth axial direction is defined as V/G, and V/G in a case where nitrogen, hydrogen, and carbon are not added to the silicon single crystal is defined as $(V/G)_{crit}$, crystal pulling conditions are controlled such that V/G is not less than $0.9\times(V/G)_{crit}$ and not more than $2.5\times(V/G)_{crit}$, where V represents the pulling rate [mm/min], G represents the average temperature gradient [° C./mm] in the crystal growth axial direction from a melting point to 1350° C., and $(V/G)_{crit}$ is the V/G value of a portion corresponding to the boundary between an I region and a V region in the silicon single crystal to which nitrogen, hydrogen, and carbon are not added, the V region being a region into which excessive vacancies are introduced from a solid-liquid interface during crystal growth, and the I region being a region into which excessive interstitials are introduced from the solid-liquid interface during the crystal growth. In addition, the hydrogen partial pressure within the crystal pulling furnace is set to not less than 3 Pa and not greater than 40 Pa. The grown silicon single crystal is a silicon single crystal to which nitrogen, carbon, and hydrogen are added, having a nitrogen concentration of more than $5\times10^{14}$ atoms/cm$^3$ and not more than $6\times10^{15}$ atoms/cm$^3$, and a carbon concentration of not less than $1\times10^{15}$ atoms/cm$^3$ and not more than $9\times10^{15}$ atoms/cm$^3$. In the step of heat treating, heat treatment is performed in a noble gas atmosphere having an impurity concentration of not more than 5 ppma, or in a non-oxidizing atmosphere in which a film thickness of an oxide film to be formed on a surface of the substrate after the heat treatment is suppressed to not more than 2 nm, at a heating temperature of not less than 1150° C. and not more than 1250° C., for a heating time period of not less than 10 minutes and not more than two hours.

DETAILED DESCRIPTION OF THE PREFERRED EMBODIMENT

Figure 1:
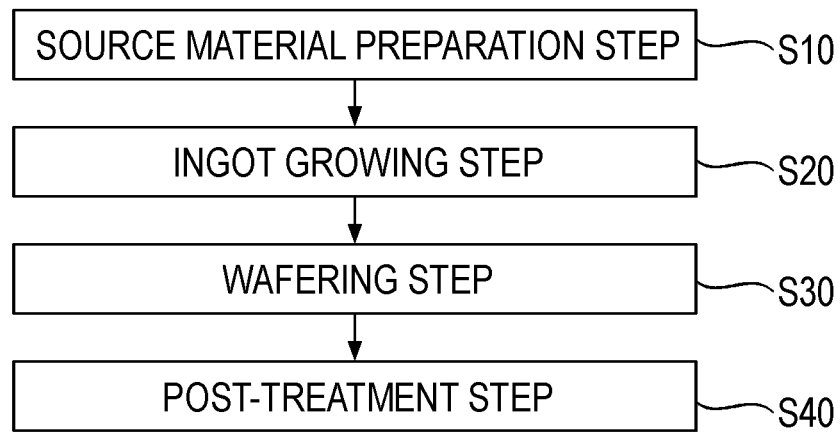
FIG. 1 is a flowchart for illustrating a method of manufacturing an annealed wafer in accordance with the present invention.

With the inventive method, the concentration of carbon added to the silicon single crystal and the hydrogen partial pressure in the atmosphere are controlled in the step of growing the silicon single crystal as described above, and thereby occurrence of defects in the silicon single crystal can be suppressed with a nitrogen concentration in a range wider than the conventional range. That is, the range of the nitrogen concentration which is suitable in the step of growing the silicon single crystal can be widened when compared with the conventional range. As a result, operating conditions during silicon single crystal growth can have a greater degree of freedom, and consequently, the probability of occurrence of defects in the annealed wafer can be reduced. Therefore, an increase in manufacturing cost of the annealed wafer due to occurrence of defects can be suppressed.

According to the method of manufacturing an annealed wafer in accordance with the present invention, by controlling the hydrogen partial pressure in the atmosphere and the carbon concentration added to the silicon single crystal during silicon single crystal growth, residual voids after annealing, and deterioration of TDDB characteristics of the oxide film formed on the annealed wafer can be suppressed with a nitrogen concentration contained in the silicon single crystal which is in a range wider than the conventional range.

Hereinafter, an embodiment of the present invention will be described with reference to the drawings. It is to be noted that, in the drawings below, identical or corresponding parts will be designated by the same reference numerals, and the description thereof will not be repeated.

Referring to FIG. 1, a method of manufacturing an annealed wafer as one embodiment of the present invention will be described.

Referring to FIG. 1, in the method of manufacturing an annealed wafer in accordance with the present invention, a source material preparation step (S10) is firstly performed. In this step (S10), silicon serving as a source material for a silicon single crystal is prepared. The prepared silicon may be, for example, polycrystalline silicon. Such silicon is introduced into a crucible within a crystal pulling furnace as an apparatus for manufacturing the silicon single crystal. Further, since nitrogen and carbon are added to the silicon single crystal to be formed, for example, materials containing nitrogen and carbon are mixed into silicon as the source material. For example, as materials to be introduced, a silicon substrate having a nitride film formed on a surface can be used as a nitrogen source, and carbon powder can be used as a carbon source. As a method of adding nitrogen, other methods, such as introducing nitrogen gas as an atmosphere gas while source material silicon is being melted, can also be used.

Next, as shown in FIG. 1, an ingot growing step (S20) from silicon to which nitrogen, carbon, and hydrogen are added is performed by the Czochralski method. In this step (S20), the atmosphere within the crystal pulling furnace is controlled to a predetermined atmosphere, and the source material silicon within the crucible is melted to obtain a silicon melt. Subsequently, a seed crystal is brought into contact with the silicon melt, and then the seed crystal and a growing silicon single crystal are pulled from the crucible, allowing the silicon single crystal to keep growing. With respect to growth conditions for manufacturing the silicon single crystal by the Czochralski method in this step (S20), if the ratio between the crystal pulling rate V (mm/min) and the average temperature gradient G (° C./mm) in the crystal growth axial direction is defined as V/G, and V/G in a case where nitrogen, hydrogen, and carbon are not added to the silicon single crystal is defined as $(V/G)_{crit}$, crystal pulling conditions are controlled such that V/G is not less than $0.9 \times (V/G)_{crit}$ and not more than $2.5 \times (V/G)_{crit}$. If V/G is less than $0.9 \times (V/G)_{crit}$, V is reduced and thus productivity is reduced, which is not preferable. Further, in view of practical cooling capability of the pulling furnace, it is difficult to achieve a V/G that is more than $2.5 \times (V/G)_{crit}$.

In addition, the hydrogen partial pressure within the crystal pulling furnace is set to not less than 3 Pa and not greater than 40 Pa. If the hydrogen partial pressure is less than 3 Pa, the effects of suppressing residual voids after annealing, and the deterioration of TDDB characteristics of an oxide film formed on the annealed wafer are not exhibited. If the hydrogen partial pressure is greater than 40 Pa, excessively introduced hydrogen combines with vacancies to form new huge voids, causing an increase in residual voids after annealing.

As a crystal growth apparatus used herein, an apparatus of any configuration can be used as long as it can perform operating conditions as described above. The silicon single crystal grown as described above is a silicon single crystal to which nitrogen, carbon, and hydrogen are added having a nitrogen concentration of more than $5 \times 10^{14}$ atoms/cm$^3$ and not more than $6 \times 10^{15}$ atoms/cm$^3$, and a carbon concentration of not less than $1 \times 10^{15}$ atoms/cm$^3$ and not more than $9 \times 10^{15}$ atoms/cm$^3$. If the nitrogen concentration is less than 5E14 (that is, $5 \times 10^{14}$) atoms/cm$^3$, the effect of reducing the size of voids by nitrogen is insufficient, causing an increase in residual voids after annealing. If the nitrogen concentration exceeds 6E15 (that is, $6 \times 10^{15}$) atoms/cm$^3$, nitrogen is crystallized in the melt, making it difficult to manufacture the crystal. In the case where carbon is added such that the carbon concentration is not less than $1 \times 10^{15}$ atoms/cm$^3$ and not more than $9 \times 10^{15}$ atoms/cm$^3$, residual voids after annealing and deterioration of the TDDB characteristics of the oxide film formed on the annealed wafer can be suppressed effectively by further adding hydrogen at not less than 3 Pa and not greater than 40 Pa.

Figure 2:
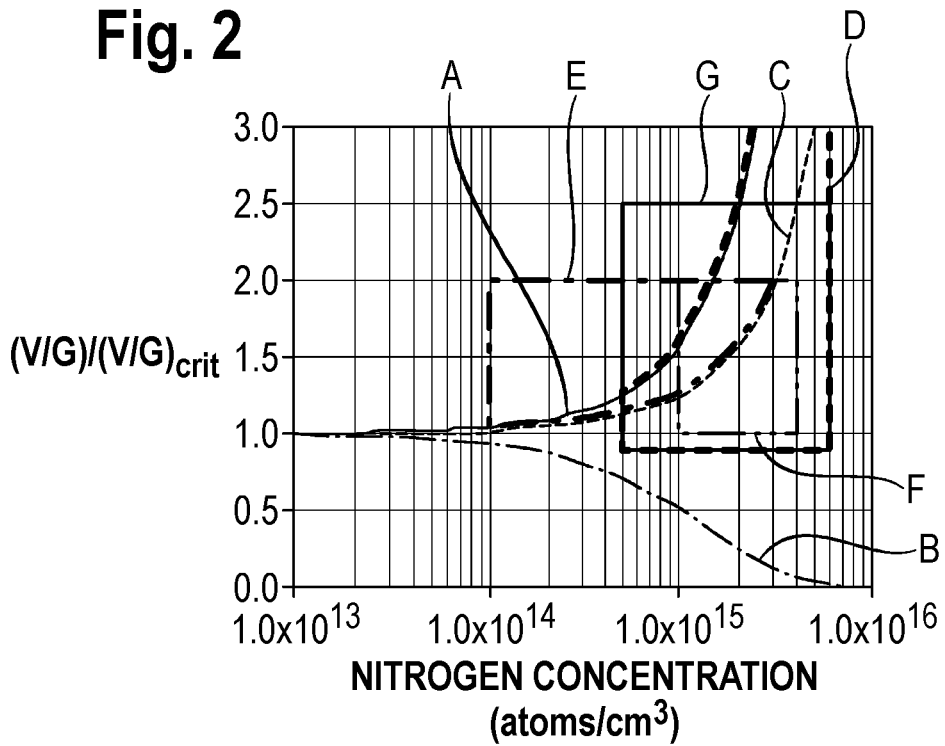
FIG. 2 is a graph showing relationship between nitrogen concentration and $(V/G)/(V/G)_{crit}$ in a silicon single crystal grown by the Czochralski method.

In a graph showing the relationship between nitrogen concentration and $(V/G)/(V/G)_{crit}$, the growth conditions described above are indicated by a region surrounded by a line segment G in FIG. 2. In FIG. 2, the abscissa represents nitrogen concentration (atoms/cm$^3$), and the ordinate represents $(V/G)/(V/G)_{crit}$. Further, a curve A in the graph shown in FIG. 2 indicates a boundary line representing an upper limit of an OSF (Oxidation induced Stacking Fault) region as a conditional region where OSFs occur. As a method of evaluating the OSF region, for example, a method as described below can be used. Specifically, a wafer is subjected to oxidation treatment in an atmosphere of oxygen containing water vapor at 1100° C. for one hour, an oxide film is removed with hydrofluoric acid, and then the wafer is etched by 1.5 μm with a light etching solution. Thereafter, elliptical, semilunar, or rod-like OSF pits generated in a surface are observed with an optical microscope. In this case, a region in which an area density of OSF etch pits [pits/cm$^2$] is not less than 100 pits/cm$^2$ is referred to as the OSF region.

In addition, a curve B in the graph shown in FIG. 2 indicates a boundary line representing an upper limit of an I region as a conditional region where excessive interstitials are introduced from the solid-liquid interface during crystal growth. As a method of evaluating the I region, for example, a method as described below can be used. Specifically, a region in which the number of BMDs (Bulk Micro Defects) after precipitation heat treatment including heating at 780° C. for three hours and heating at 1000° C. for 16 hours is performed is less than $1 \times 10^8$/cm$^3$ is referred to as the I region.

Further, a curve C in the graph shown in FIG. 2 indicates a boundary line representing a lower limit of a V region as a conditional region where excessive vacancies are introduced from the solid-liquid interface during the crystal growth. As a method of evaluating the V region, for example, a method as described below can be used. Specifically, octahedral voids having a diagonal length of not less than 80 nm are measured using an LSTD scanner (MO-6) manufactured by Raytex Corporation as a commercially available defect evaluation apparatus, and a region in which the voids have a volume density of not less than 1E5/cm$^3$ is referred to as the V region.

Subsequently, a wafering step (S30) as a step of cutting out a substrate from the silicon single crystal is performed. In this step (S30), a substrate is cut out from an ingot of the silicon single crystal obtained in the above step (S20), by an arbitrary method. For example, the periphery of a straight part of the ingot is ground such that the straight part has an outer diameter of a predetermined value, and thereafter the ingot is sliced using a cutting apparatus such as a wire saw. A main surface of the substrate obtained as described above is further polished to provide a mirror finish on the main surface. In this manner, the substrate is prepared.

Next, a post-treatment step (S40) as a step of heat treating the cut-out substrate is performed. In this step (S40), heat treatment is performed on the substrate in a noble gas atmosphere having an impurity concentration of not more than 5 ppma, or in a non-oxidizing atmosphere in which a film thickness of an oxide film to be formed on a surface of the substrate after the heat treatment is suppressed to not more than 2 nm, at a heating temperature of not less than 1150° C. and not more than 1250° C., for a heating time period of not less than 10 minutes and not more than two hours.

With this procedure, the concentration of carbon added to the silicon single crystal and the hydrogen partial pressure in the atmosphere are controlled in the step of growing the silicon single crystal as described above, and thereby occurrence of defects in the silicon single crystal can be suppressed by nitrogen concentration in a range wider than a conventional range. That is, the range of the nitrogen concentration that is applicable in the step of growing the silicon single crystal can be widened when compared with the conventional range. As a result, the operating conditions in the step of growing the silicon single crystal can have a greater degree of freedom, and consequently, the probability of the occurrence of defects in the method of manufacturing an annealed wafer can be reduced. Therefore, an increase in manufacturing cost of the anneal wafer due to occurrence of defects can be suppressed.

Preferably, in the above step (S20) as the step of growing the silicon single crystal as described above, nitrogen and carbon are added to the silicon melt. In this case, nitrogen and carbon can be easily added to the silicon single crystal.

Further, according to the method of manufacturing an annealed wafer described above, when the silicon single crystal is formed and then cooled in the above step (S20) as the step of growing the silicon single crystal, a rate of cooling from 1100° C. to 1000° C. may not be more than 2.5° C./min. In this case, the applicable range of the nitrogen concentration can be reliably widened while suppressing occurrence of defects as described above.

Figure 3:
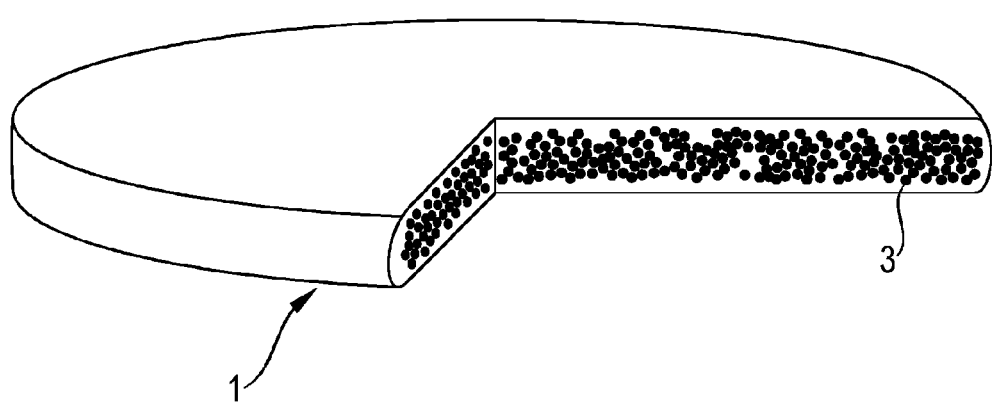
FIG. 3 is a schematic diagram of an annealed wafer manufactured using the method of manufacturing an annealed wafer in accordance with the present invention.
Figure 4:
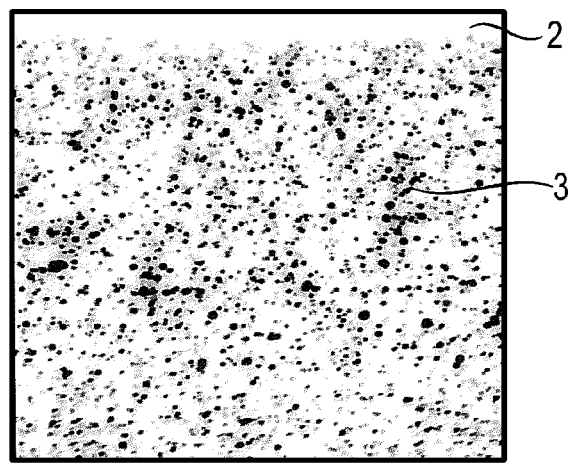
FIG. 4 is a cross-section diagram showing a defect distribution in the proximity of a surface of the annealed wafer shown in FIG. 3.

In this manner, an annealed wafer 1 shown in FIGS. 3 and 4 is obtained. As shown in FIGS. 3 and 4, a surface layer of annealed wafer 1 is a substantially denuded zone (DZ) 2. In contrast, voids and oxygen precipitates 3 are formed in a central portion of annealed wafer 1 in a thickness direction. Oxygen precipitates 3 exert an effect of absorbing impurities such as heavy metal and thereby keeping a wafer surface clean when annealed wafer 1 is used to form a device.

Figure 5:
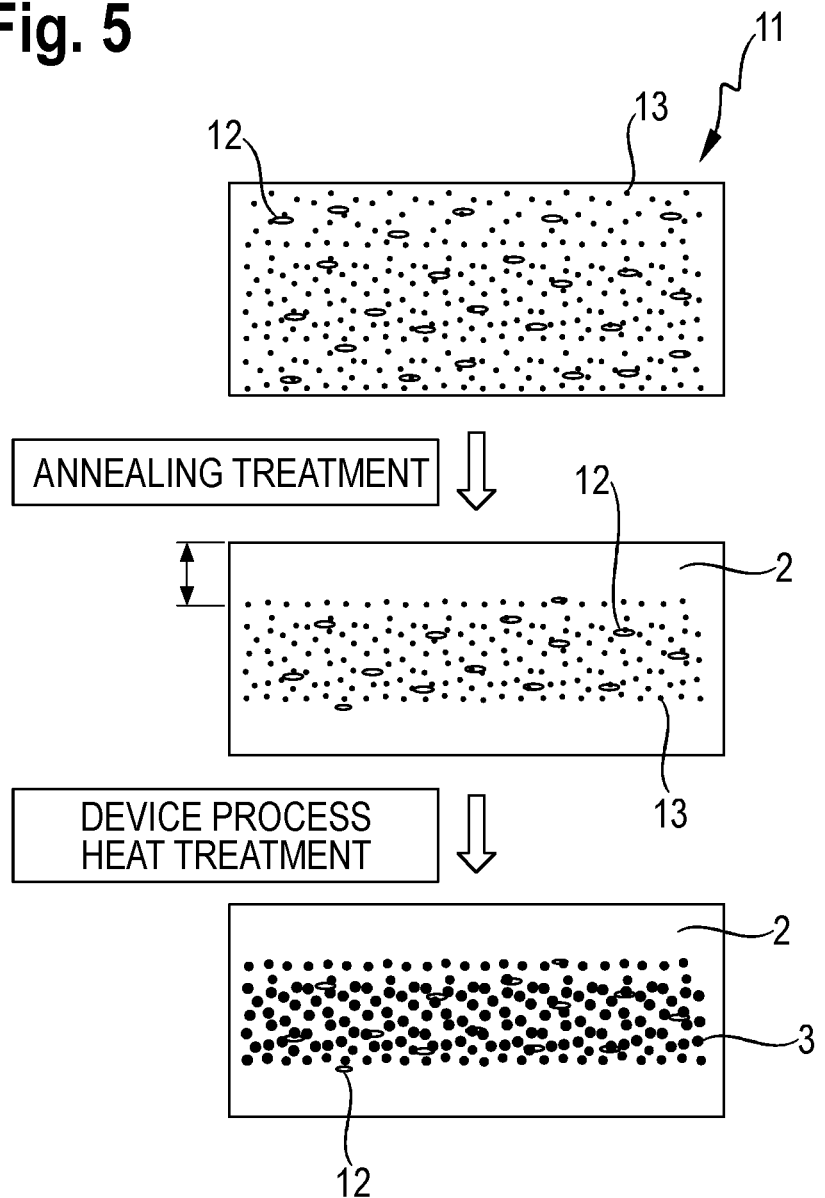
FIG. 5 is a schematic diagram for illustrating an effect of the annealed wafer manufactured using the method of manufacturing an annealed wafer in accordance with the present invention.

More specifically, a description will be given with reference to FIG. 5. FIG. 5 is a schematic diagram showing cross sections of a wafer in the step (S30) and the step (S40) described above and after heat treatment in the step of forming a device at a surface of the wafer. The uppermost portion of FIG. 5 schematically shows a cross section of the wafer obtained in step (S30). The middle portion of FIG. 5 schematically shows a cross section of the wafer obtained after the annealing treatment (heat treatment) is performed in step (S40). The lowermost portion of FIG. 5 schematically shows a cross section of the wafer obtained after heat treatment is performed in a step of forming a semiconductor device at the surface of the wafer. As shown in FIG. 5, in the inside of a wafer 11 obtained in the above step (S30), voids 12 and oxygen precipitate nuclei 13 are formed almost entirely in the thickness direction. Thereafter, by performing annealing treatment in the above step (S40), voids and oxygen precipitate nuclei are eliminated in a surface layer of the wafer, and substantially defect-free denuded zone 2 is formed, as shown in the middle portion of FIG. 5. On the other hand, voids 12 and oxygen precipitate nuclei 13 (or oxygen precipitates) are present in a central portion of the wafer in the thickness direction. Further, after heat treatment is performed in the step of forming the semiconductor device, oxygen precipitates 3 are formed in the central portion of the wafer in the thickness direction, as shown in the lowermost portion of FIG. 5. As a result, oxygen precipitates 3 can fully exert the function of absorbing impurities described above in the step of forming the device.

Hereinafter, examples of the present invention will be described. It is to be noted that the present invention is not limited to the examples described below. Further, although a crystal (ingot) with a diameter of 200 mm is used in the examples described below, the same principle is also applicable to a crystal with a diameter of not less than 300 mm.

(1) Crystal Structure

An apparatus for manufacturing a silicon single crystal used in the present examples is a pulling furnace used to manufacture a silicon single crystal by the ordinary Czochralski method (CZ method), and having an ordinary cooling rate. In implementing the present invention, the configuration or type of the pulling furnace is not particularly limited as long as it can perform the growth conditions of the present invention.

The silicon single crystal grown utilizing the above apparatus was of a p-type conductivity type (doped with boron), with a crystal diameter of eight inches (200 mm). Nitrogen, carbon, and hydrogen were added to the silicon single crystal.

Nitrogen was added by introducing a silicon substrate with a nitride film into the silicon melt. Hydrogen was added by introducing a mixed gas containing hydrogen and argon having a volume ratio of hydrogen of 3.8% into the pulling furnace, and the hydrogen partial pressure was controlled to 3 to 60 Pa by changing the pressure within the furnace and the flow ratio of the mixed gas containing hydrogen and argon. Carbon was added by introducing carbon powder into the silicon melt. The nitrogen concentration and carbon concentration in the silicon single crystal were evaluated by a method described later.

In addition, a relative V/G value referred to as $(V/G)/(V/G)_{crit}$ was defined as described below.

Firstly, in a pulling furnace with the same structure as that of the pulling furnace in which the silicon crystal to which nitrogen, hydrogen, and carbon were added, crystals to which nitrogen, hydrogen, and carbon were not added were pulled at various pulling rates V. Wafers were cut out from the crystals to which nitrogen, hydrogen, and carbon were not added, and subjected to precipitation heat treatment including heating at 780° C. for three hours and heating at 1000° C. for 16 hours. Thereafter, BMDs (Bulk Micro Defects) were measured with a BMD analyzer. A region in which the number of BMDs was not less than $1\times10^8/cm^3$ was referred to as a V-rich region, a region in which the number of BMDs was less than $1\times10^8/cm^3$ was referred to as an I-rich region, and a boundary between the V-rich region and the I-rich region was defined as a V-I boundary. In this case, a V/G value at the V-I boundary position corresponds to $(V/G)_{crit}$.

It is to be noted that the absolute value of V/G cannot be determined unless the absolute value of G is determined. However, if relative V/G obtained by standardizing V/G using $(V/G)_{crit}$ is defined, a region in which the relative V/G is larger than 1 is the V-rich region, and a region in which the relative V/G is smaller than 1 is the I-rich region. In addition, if the relationship between the pulling rate and the V-I boundary position is investigated beforehand, a relative V/G value in a surface of a crystal pulled at a certain pulling rate V using a pulling furnace with the same structure can be determined.

Here, in a growing crystal, a peripheral portion thereof is more likely to be cooled, and thus G is larger at the crystal peripheral portion. In the apparatus for manufacturing a silicon single crystal used herein, G at the crystal peripheral portion was not less than 1.4 times G at the crystal central portion.

Conditions for nitrogen concentrations, carbon concentrations, V/G minimum values (values at the crystal peripheral portion), V/G maximum values (values at the crystal central portion), and hydrogen partial pressures of the evaluated crystals were set as shown in Table 1 described later.

(2) Production of Annealed Wafer

A plurality of substrates were cut out from the same portion of a straight part of each single crystal ingot grown by the method described above, using a wire saw, and mirror polished, to produce silicon substrates (hereinafter also simply referred to as substrates).

The obtained substrates were introduced into a batch-type vertical heat treatment furnace with a purge function in which the temperature within the reaction chamber is kept at a predetermined temperature, and high-temperature heat treatment was performed under an argon gas atmosphere at a temperature of 1200° C. for a time period of one hour (hereinafter, a wafer subjected to the heat treatment will also be referred to as an "annealed wafer"). It is to be noted that an oxide film after the high-temperature heat treatment had a thickness of not more than 2 nm.

(3) Evaluation Method

[Evaluation of Nitrogen Concentration]

A sample was taken from the substrates, and polished by 20 μm to remove a nitrogen outward diffusion layer on a surface, and thereafter nitrogen concentration was measured using a secondary ion mass spectroscope (SIMS). Further, since SIMS cannot be used to perform measurement on a wafer having a nitrogen concentration of not more than $5 \times 10^{14}$ atoms/cm$^3$, a calculated value determined from a solidified fraction was used instead. Specifically, a calculation formula for determining the nitrogen concentration from the solidified fraction is defined as follows:

$g$=(Mass of Crystallized Silicon)/(Mass of Initial Melt)  (Formula 1), where g is a solidified fraction. Then, the nitrogen concentration in the crystal can be determined by a formula described below:

(Nitrogen Concentration in Crystal)=$k \times$(Nitrogen Concentration in Initial Melt)$\times (1-g)^{k-1}$  (Formula 2), where k is a segregation coefficient of nitrogen.

[Evaluation of Carbon Concentration]

Carbon concentration was determined by performing measurement on the substrates by an infrared absorption method and performing arithmetic processing on the measured data. As a conversion factor used for the arithmetic processing, a value published by JEITA (Japan Electronics and Information Technology Industries Association) was used. Specifically, the conversion factor for the carbon concentration is $8.1 \times 10^{16}$/cm$^2$.

[Evaluation of Residual Voids]

Residual voids in the annealed wafer were measured using an LSTD scanner (MO-6) manufactured by Raytex Corporation as a commercially available defect evaluation apparatus. MO-6 emits visible-light laser from a Brewster angle, and senses a scattered image of p polarization as a defect image with a camera disposed in a vertical direction. Since the laser penetrates 5 μm into the substrate surface, the apparatus can measure a defect located from the substrate surface to a depth of 5 μm. Upon measurement, detection sensitivity was adjusted such that octahedral voids having a diagonal length of not less than 80 nm were able to be measured.

[Evaluation of TDDB Defect Density]

TDDB defect density of the annealed wafer was evaluated as described below. In a surface of the annealed wafer, 264 polysilicon gate MOSs were formed, and the number N of defective polysilicon gate MOSs having TDDB (Time Dependent Dielectric Breakdown) characteristics of not more than a predetermined reference value was determined. Then, a density D (/cm$^2$) of TDDB defects causing a failure in the TDDB characteristics was calculated from an electrode area A and the number N of defective polysilicon gate MOSs, according to Formula 3 described below:

$D=-\ln(1-N/264)/A$  (Formula 3).

The polysilicon gate MOS used herein has a structure in which a polysilicon electrode is placed on an oxide film. The oxide film was formed on the surface of the annealed wafer to have a thickness of 25 nm, by thermal oxidation treatment in which heating was performed in a dry oxygen atmosphere at a temperature of 1000° C. On the oxide film, 264 polysilicon electrodes having an area of 0.5 cm$^2$ were formed.

The TDDB characteristics of the polysilicon gate MOS were evaluated by a method described below. A stress current of 5 mA/cm$^2$ was continuously applied to the polysilicon gate MOS, and when an electric field of the oxide film was equal to or more than an electric field for determination of 10 MV/cm, it was determined that the polysilicon gate MOS had been broken down. Charge-to-breakdown Qbd (C/cm$^2$) was calculated by multiplying a time period for which breakdown of the polysilicon gate MOS occurred by the stress current. The polysilicon gate MOS having Qbd of not more than 4 C/cm$^2$ was determined as defective.

(4) Evaluation Results

Table 1 below shows evaluation results.

TABLE 1

| Classification | Nitrogen Concentration [atoms/cm$^3$] | Pulling Rate [mm/min] | V/G Minimum Value [relative value] | V/G Maximum Value [relative value] | Hydrogen Partial Pressure [Pa] | Carbon Concentration [atoms/cm$^3$] | Residual Voids [voids/wafer] | TDDB Defect Density [/cm$^2$] |
|---|---|---|---|---|---|---|---|---|
| Example 1 | 5.0E+14 | 1.0 | 1.0 | 2.0 | 3 | 9.0E+15 | 985 | 0.08 |
| Example 2 | 5.0E+14 | 1.9 | 1.7 | 2.5 | 40 | 5.0E+15 | 352 | 0.05 |
| Example 3 | 2.0E+15 | 0.9 | 0.9 | 1.3 | 20 | 1.0E+15 | 425 | 0.10 |
| Example 4 | 2.0E+15 | 1.5 | 1.5 | 2.3 | 20 | 1.0E+15 | 354 | 0.08 |
| Example 5 | 6.0E+15 | 1.9 | 1.7 | 2.5 | 40 | 5.0E+15 | 102 | 0.07 |
| Comparative Example 1 | 1.0E+15 | 1.0 | 1.0 | 2.0 | No | No | 2615 | 0.09 |
| Comparative Example 2 | 4.5E+15 | 1.0 | 1.0 | 2.0 | No | No | 231 | 1.50 |
| Comparative Example 3 | 4.0E+14 | 1.0 | 1.0 | 2.0 | 40 | 4.0E+15 | 3521 | 0.12 |
| Comparative Example 4 | 2.0E+15 | 1.0 | 1.0 | 2.0 | No | 3.0E+15 | 325 | 0.62 |
| Comparative Example 5 | 2.0E+15 | 1.0 | 1.0 | 2.0 | 40 | No | 502 | 0.57 |
| Comparative Example 6 | 2.0E+15 | 1.0 | 1.0 | 2.0 | 60 | 5.0E+15 | 4685 | 0.07 |

As can be seen from Table 1, according to the results of Examples 1 to 5 of the present invention, in the case where the hydrogen partial pressure is not less than 3 Pa and not more than 40 Pa, and the carbon concentration is not less than $1\times10^{15}$ atoms/cm$^3$ and not more than $9\times10^{15}$ atoms/cm$^3$, residual voids are not more than 2000 voids/wafer and the TDDB defect density is not more than 0.3/cm$^2$ when the nitrogen concentration is in the range of more than $5\times10^{14}$ atoms/cm$^3$ and not more than $6\times10^{15}$ atoms/cm$^3$, exhibiting good results.

Although the embodiment and examples of the present invention have been described, it should be understood that the embodiment and examples disclosed herein are illustrative and non-restrictive in every respect. The scope of the present invention is defined by the scope of the claims, and is intended to include any modifications within the scope and meaning equivalent to the scope of the claims.

The invention claimed is:

1. A method of manufacturing an annealed wafer, comprising the steps of:
   a) growing a silicon single crystal by the Czochralski method from a silicon melt to which nitrogen, carbon, and hydrogen are added in a crystal pulling furnace;
   b) cutting out a substrate from said silicon single crystal; and
   c) heat treating said substrate, wherein, during growth of the silicon single crystal in step a),
      a)i) the ratio of a crystal pulling rate V (mm/min) and an average temperature gradient G (° C./mm) in a crystal growth axial direction is defined as V/G, and V/G in a case where nitrogen, hydrogen, and carbon are not added to a silicon single crystal is defined as $(V/G)_{crit}$, crystal pulling conditions are controlled such that V/G is not less than $0.9\times(V/G)_{crit}$ and not more than $2.5\times(V/G)_{crit}$ (where V represents the pulling rate [mm/min], G represents the average temperature gradient [° C./mm] in the crystal growth axial direction from a melting point to 1350° C., and $(V/G)_{crit}$ is the V/G value of a portion corresponding to a boundary between an I region and a V region in the silicon single crystal to which nitrogen, hydrogen, and carbon are not added, said V region being a region into which excessive vacancies are introduced from a solid-liquid interface during crystal growth, and said I region being a region into which excessive interstitials are introduced from the solid-liquid interface during the crystal growth),
      a)ii) a hydrogen partial pressure within the crystal pulling furnace is set to not less than 3 Pa and not more than 40 Pa,
      a)iii) and the silicon single crystal grown in the step of growing the silicon single crystal is a silicon single crystal having a nitrogen concentration of more than $5\times10^{14}$ atoms/cm$^3$ and not more than $6\times10^{15}$ atoms/cm$^3$, and a carbon concentration of not less than $1\times10^{15}$ atoms/cm$^3$ and not more than $9\times10^{15}$ atoms/cm$^3$, and
   during heat treating in step c), heat treatment is performed in a noble gas atmosphere having an impurity concentration of not more than 5 ppma, or in a non-oxidizing atmosphere in which a film thickness of an oxide film to be formed on a surface of said substrate after the heat treatment is suppressed to not more than 2 nm, at a heating temperature of not less than 1150° C. and not more than 1250° C., for a heating time period of not less than 10 minutes and not more than two hours.

2. The method of manufacturing an annealed wafer of claim 1, wherein, in step a) of growing the silicon single crystal, nitrogen and carbon are added to the silicon melt.

3. The method of manufacturing an annealed wafer of claim 1, wherein, in the step of growing the silicon single crystal, the rate of cooling from 1100 ° C. to 1000° C. is not more than 2.5° C./min.

4. The method of manufacturing an annealed wafer of claim 2, wherein, in the step of growing the silicon single crystal, the rate of cooling from 1100° C. to 1000° C. is not more than 2.5° C./min.

* * * * *